United States Patent
Li

(10) Patent No.: US 11,066,737 B2
(45) Date of Patent: Jul. 20, 2021

(54) FRAME COMPONENT

(71) Applicants: Ordos Yuansheng Optoelectronics Co., Ltd., Inner Mongolia (CN); BOE Technology Group Co., Ltd., Beijing (CN)

(72) Inventor: Dongwei Li, Beijing (CN)

(73) Assignees: Ordos Yuansheng Optoelectronics Co., Ltd., Inner Mongolia (CN); BOE Technology Group Co., Ltd., Beijing (CN)

(*) Notice: Subject to any disclaimer, the term of this patent is extended or adjusted under 35 U.S.C. 154(b) by 83 days.

(21) Appl. No.: 16/398,406

(22) Filed: Apr. 30, 2019

(65) Prior Publication Data

US 2020/0032382 A1    Jan. 30, 2020

(30) Foreign Application Priority Data

Jul. 27, 2018    (CN) .......................... 201810843689.2

(51) Int. Cl.
  *C23C 14/04* (2006.01)
  *B05C 21/00* (2006.01)

(52) U.S. Cl.
  CPC .......... *C23C 14/042* (2013.01); *B05C 21/005* (2013.01)

(58) Field of Classification Search
  None
  See application file for complete search history.

(56) References Cited

U.S. PATENT DOCUMENTS

| | | | |
|---|---|---|---|
| 9,530,961 B2 | 12/2016 | Yi et al. | |
| 9,666,346 B2 | 5/2017 | Noh et al. | |
| 2009/0137180 A1* | 5/2009 | Sung | C23C 14/042 445/60 |
| 2010/0192856 A1* | 8/2010 | Sung | H01L 51/0011 118/721 |
| 2018/0148824 A1 | 5/2018 | Gao | |
| 2018/0202034 A1 | 7/2018 | Lin et al. | |
| 2018/0209029 A1 | 7/2018 | Lin et al. | |

FOREIGN PATENT DOCUMENTS

| | | | | |
|---|---|---|---|---|
| CN | 105039907 A | | 11/2015 | |
| CN | 105839052 A | | 8/2016 | |
| CN | 205662586 U | | 10/2016 | |
| CN | 106086782 A | | 11/2016 | |
| CN | 205893376 | * | 1/2017 | .......... C23C 14/042 |
| CN | 205893376 U | | 1/2017 | |
| CN | 206188877 U | | 5/2017 | |
| CN | 107435130 A | | 12/2017 | |
| CN | 108251792 A | | 7/2018 | |

OTHER PUBLICATIONS

Chinese Office Action dated Aug. 19, 2019 in related Chinese Application No. 201810843689.2.
Chinese Office Action dated Dec. 2, 2019 in related Chinese Application No. 201810843689.2.

* cited by examiner

*Primary Examiner* — Jethro M. Pence
(74) *Attorney, Agent, or Firm* — Arent Fox LLP; Michael Fainberg

(57) ABSTRACT

The disclosure discloses a frame component, which includes a frame with a positioning slot in an inner edge thereof, a fabrication strip with grooves, and a plurality of support pieces; where the fabrication strip is detachably arranged in the positioning slot, and the plurality of support pieces are fixed in the grooves to form a support plane for supporting a mask.

20 Claims, 2 Drawing Sheets

FRAME COMPONENT

CROSS-REFERENCE TO RELATED APPLICATION

This Application claims priority to Chinese Patent Application No. 201810843689.2, filed on Jul. 27, 2018, the content of which is incorporated by reference in the entirety.

TECHNICAL FIELD

This disclosure relates to the field of surface treatment technologies, and particularly to a frame component.

DESCRIPTION OF THE RELATED ART

In the field of surface treatment technologies, a fine metal mask (FMM Mask) mode is implemented by depositing an OLED (organic light emitting diode) material onto an LTPS (low-temperature poly-silicon) back panel according to a preset program by means of vapor-deposition; and in the vapor-deposition process, organic matters are deposited onto specified positions using patterns on the FMM (fine metal).

SUMMARY

The embodiments of the disclosure provide a frame component.

The frame component includes: a frame with a positioning slot in an inner edge thereof; a fabrication strip with grooves; and a plurality of support pieces; wherein the fabrication strip is detachably arranged in the positioning slot, and the plurality of support pieces are fixed in the grooves to form a support plane for supporting a mask.

In some embodiments, the fabrication strip is welded into the positioning slot.

In some embodiments, the fabrication strip is welded into the positioning slot by: welding a fabrication strip in an encircled shape into the positioning slot; wherein the fabrication strip in the encircled shape is fit closely onto an inner edge of the positioning slot along an internal contour of the positioning slot; and cutting the fabrication strip in the encircled shape via a laser cutting process at positions where the grooves need to be arranged, to obtain the grooves.

In some embodiments, the fabrication strip includes a plurality of fabrication sheets welded into the positioning slot; wherein the plurality of fabrication sheets are fit closely onto an inner edge of the positioning slot, and are arranged spaced apart from each other along an internal contour of the positioning slot; and an interval between every two adjacent fabrication sheets of the plurality of fabrication sheets constitutes one of the grooves.

In some embodiments, the fabrication strip is adhered into the positioning slot.

In some embodiments, the fabrication strip is adhered into the positioning slot by: adhering a fabrication strip in an encircled shape into the positioning slot; wherein the fabrication strip in the encircled shape is fit closely onto an inner edge of the positioning slot along an internal contour of the positioning slot; and cutting the fabrication strip in the encircled shape via a laser cutting process at positions where the grooves need to be arranged, to obtain the grooves.

In some embodiments, the fabrication strip includes a plurality of fabrication sheets adhered into the positioning slot; wherein the plurality of fabrication sheets are fit closely onto an inner edge of the positioning slot, and are arranged spaced apart from each other along an internal contour of the positioning slot; and an interval between every two adjacent fabrication sheets of the plurality of fabrication sheets constitutes one of the grooves.

In some embodiments, the fabrication strip is made of a metal material.

In some embodiments, the metal material includes an Invar36 or a SUS304.

In some embodiments, a thickness of the fabrication strip is not less than a thickness of each of the plurality of support pieces.

In some embodiments, a thickness of the fabrication strip is approximately 100 μm.

In some embodiments, a depth of the positioning slot is greater than a thickness of the fabrication strip.

In some embodiments, a difference between the depth of the positioning slot and the thickness of the fabrication strip ranges from 10 μm to 20 μm.

In some embodiments, the frame has a rectangular-ring-like shape.

In some embodiments, the plurality of support pieces include a plurality of first support pieces and a plurality of second support pieces, fixed in the grooves; wherein the plurality of first support pieces and the plurality of second support pieces are parallel to two vertically intersected sides of the frame, respectively; the plurality of second support pieces cooperate with each other to form the support plane; and the plurality of first support pieces are configured to divide the support plane into a plurality of blocking areas.

In some embodiments, the plurality of first support pieces are cover sheets; and the cover sheets are welded into the grooves.

In some embodiments, the plurality of first support pieces are cover sheets; and the cover sheets are adhered into the grooves.

In some embodiments, the plurality of second support pieces are howling sheets; and the howling sheets are welded into the grooves.

In some embodiments, the plurality of second support pieces are howling sheets; and the howling sheets are adhered into the grooves.

In some embodiments, the fabrication strip and the plurality of support pieces are formed integrally.

BRIEF DESCRIPTION OF THE DRAWINGS

In order to make the technical solutions according to the embodiments of the disclosure more apparent, the drawings to which a description of the embodiments refers will be briefly introduced below, and apparently the drawings to be described below are merely illustrative of some of the embodiments of the disclosure, and those ordinarily skilled in the art can derive from these drawings other drawings without any inventive effort.

DETAILED DESCRIPTION OF THE EMBODIMENTS

In the related art, only a fine metal mask of one specified width can be welded on one kind of frame due to limitation of a groove design of cover sheets on the frame in the vapor-deposition process; that is, when a product with a different model and design is to be vapor-deposited, an arrangement of corresponding grooves of cover sheets will be changed, and the frame used by the previous product will not be usable due to mismatch of grooves, thus it is necessary to replace a mask and redesign a corresponding frame, which will resulting in a waste of cost since the frames are quite high in manufacturing cost; therefore, it is particularly necessary to design a frame suitable for fixing multiple kinds of masks.

In order to make the objects, technical solutions, and advantages of the embodiments of the disclosure more apparent, the technical solutions according to the embodiments of the disclosure will be described below clearly and fully with reference to the drawings in the embodiments of the disclosure, and apparently the embodiments described below are only a part but not all of the embodiments of the disclosure. Based upon the embodiments here of the disclosure, all the other embodiments which can occur to those skilled in the art without any inventive effort shall fall into the scope of the disclosure.

Figure 1:
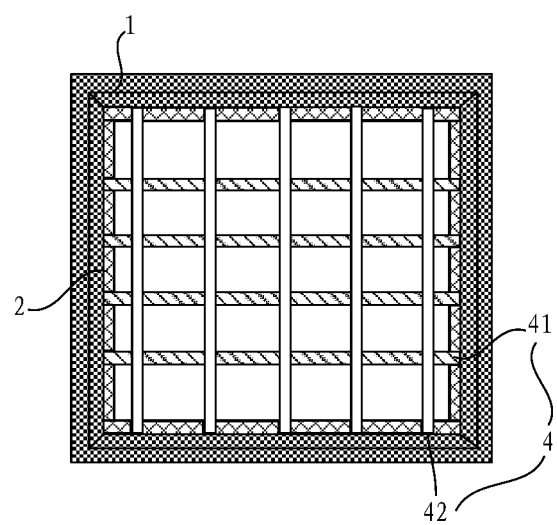
FIG. 1 is a schematic structural diagram of a frame component according to the embodiments of the disclosure.
Figure 2:
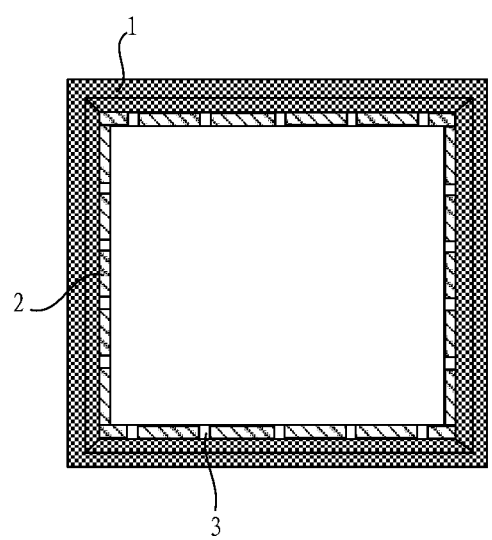
FIG. 2 is a schematic structural diagram of a frame component with support sheets removed according to the embodiments of the disclosure.

As illustrated in FIG. 1 and FIG. 2, the embodiments of the disclosure provide a frame component, including: a frame 1 with a positioning slot in an inner edge thereof, a fabrication strip 2 with grooves 3, and a plurality of support pieces 4; where the fabrication strip 2 is detachably arranged in the positioning slot, and the support pieces 4 are fixed in the grooves 3 to form a support plane for supporting a mask.

In the frame component above according to the embodiments of the disclosure, the fabrication strip 2 is detachably arranged in the positioning slot, and the grooves 3, which are used for fixing the support pieces 4, are arranged in the fabrication strip 2, so that when a to-be-vapor-deposited product changes in model and design and an arrangement of corresponding grooves need to be redesigned, it just needs to remove the fabrication strip 2 from the positioning slot of the frame 1, implement simple polishing treatment on the frame 1 and detachably install the replaced fabrication strip 2 in the positioning slot, at this time, the grooves of the fabrication strip 2 will correspond to the support pieces 4 required by the to-be-vapor-deposited product with a changed model and design, and the support pieces 4 are fixed in the grooves 3 to form a support plane for supporting a corresponding mask.

Therefore, a demand of fixing various kinds of masks can be guaranteed; and when a different mask is to be fixed, a required frame component which is used for fixing the different mask can be formed by replacing the fabrication strip 2 and arranging corresponding support pieces 4 on grooves 3 of the replaced fabrication strip 2 without completely discarding the existing frame component; therefore, the frame component can be used for fixing various kinds of masks, and is relatively good in universality, and can be fabricated in a more fast and convenience way, which will greatly improves the utilization rate of the frame 1 and saves a cost and a fabrication time thereof.

In some embodiments, in order to ensure that the fabrication strip 2 is detachably arranged in the positioning slot, the fabrication strip 2 is welded or adhered into the positioning slot.

In some embodiments, in the frame component above according to the embodiments of the disclosure, a thickness of the fabrication strip 2 is approximately 100 μm, so that the fabrication strip 2 can be detachably arranged in the positioning slot in a welding or adhering mode, or other installation modes satisfying the actual requirements.

In some embodiments, when the fabrication strip 2 is selected to be welded into the positioning slot, a fabrication strip in an encircled shape (such as a rectangular-ring-like shape, etc.), which can be closely fit onto an inner edge of the positioning slot along an internal contour of the positioning slot, can be welded into the positioning slot via a welding process, and then the fabrication strip in the encircled shape can be cut via a laser cutting process at positions where grooves need to be arranged, to thereby obtain the required grooves 3. Or, a plurality of fabrication sheets can be welded into the positioning slot, where the plurality of fabrication sheets are fit closely onto the inner edge of the positioning slot, and are arranged spaced apart from each other along the internal contour of the positioning slot, where an interval between every two adjacent fabrication sheets constitutes a required groove 3. Further, lengths of different fabrication sheets can be the same or different, which will not be limited herein.

Similarly, when the fabrication strip 2 is selected to be adhered into the positioning slot, a fabrication strip in an encircled shape, which can be closely fit onto the inner edge of the positioning slot along the internal contour of the positioning slot, can be adhered into the positioning slot via a glue that has characteristics such as a strong strength, a small deformation (less than 1 μm, for example) and not being affected by a mask cleaning process, under preconditions that precision can be guaranteed; and then, the fabrication strip in the encircled shape can be cut via a laser cutting process at positions where grooves need to be arranged, to thereby obtain the required grooves 3. Or, a plurality of fabrication sheets can be adhered into the positioning slot via a glue, where the plurality of fabrication sheets are closely fit onto the inner edge of the positioning slot, and are arranged spaced apart from each other along the internal contour of the positioning slot, where an interval between every two adjacent fabrication sheets constitutes a required groove 3. Further, lengths of different fabrication sheets can be the same or different, which will not be limited herein.

In addition, it shall be noted that, the number of the grooves 3 in the fabrication strip 2 can be adjusted as needed in a practical application, which will not be limited herein.

In some embodiments, the fabrication strip 2 can be made of a metal material.

In the frame component above according to the embodiments of the disclosure, the fabrication strip 2 can be made of the metal material or another material which can guarantee essential performances of the fabrication strip under a vapor-deposition environment; and the material for fabricating the fabrication strip 2 can be selected according to such actual situations as the application environment of the frame component, the vapor-deposition requirement of the frame component, etc., which will not be limited herein.

In some embodiments, the fabrication strip 2 can be made of Invar36.

In the frame component above according to the embodiments of the disclosure, taking such factors that a mask needs to be welded on a surface of the frame component, a thermal expansion and the like caused by a vapor-deposition temperature will occur during the vapor-deposition process, the fabrication strip 2 can be made of Invar36, of course, the fabrication strip 2 can alternatively be made of SUS304 or another metal material satisfying actual requirements, and the metal material of the fabrication strip 2 can be selected flexibly in accordance with the actual requirements of the frame component and application environments thereof.

In some embodiments, in order to guarantee that the fabrication strip 2 is matched with the support pieces 4 in thickness in an installation process, a thickness of the fabrication strip 2 is not less than a thickness of each support piece 4.

In the frame component above according to the embodiments of the disclosure, the fabrication strip 2 is as thick as each support piece 4 or the fabrication strip 2 is slightly thicker than each support piece 4, so that a depth of each groove 3 in the fabrication strip 2 is not less than the thickness of each support piece 4, namely, the support pieces 4 can be accommodated in the grooves 3, and subsequently, the mask can be arranged on a support plane formed by the support pieces and can be welded on the fabrication strip 2 relatively well.

In some embodiments, in order to guarantee that the frame 1 is matched with the fabrication strip 2 in thickness in an installation process, a depth of the positioning slot is greater than the thickness of the fabrication strip 2.

In the frame component above according to the embodiments of the disclosure, in order to facilitate the installation of the fabrication strip 2 in the positioning slot, the depth of the positioning slot is greater than the thickness of the fabrication strip 2, and in some embodiments, a difference between the depth of the positioning slot and the thickness of the fabrication strip 2 ranges from 10 μm to 20 μm, for example, the difference between the depth of the positioning slot and the thickness of the fabrication strip 2 is 10 μm, 12 μm, 14 μm, 15 μm, 16 μm, 18 μm or 20 μm, etc.

In some embodiments, as illustrated in FIG. 1, the frame 1 is in a rectangular-ring-like shape; and in some embodiments, the support pieces 4 include a plurality of first support pieces 41 and a plurality of second support pieces 42, fixed in the grooves 3; where the plurality of first support pieces 41 and the plurality of second support pieces 42 are parallel to two vertically intersected sides of the frame 1, respectively; the plurality of second support pieces 42 cooperate with each other to form the support plane; and the plurality of first support pieces 41 are configured to divide the support plane into a plurality of blocking areas.

In the frame component above according to the embodiments of the disclosure, the plurality of second support pieces 42 cooperate with each other to form the support plane for supporting the mask; and in a vapor-deposition process, the mask is arranged on the support plane, so that a sagging amount, which is relatively high in a direction perpendicular to the support plane, of the mask due to the self gravity of the mask can be reduced; further, the mask is fixed on the fabrication strip 2 by welding, thus a uniform stress on the mask is guaranteed, and influence on the precision of a pixel position due to poor boundary fixation is relieved.

In some embodiments, the first support pieces 41 are cover sheets; and the cover sheets can be welded into the grooves 3.

In the frame component above according to the embodiments of the disclosure, the cover sheets can be welded into the grooves 3 or be fixed into the grooves 3 in other ways, such as be adhered into the grooves 3 via a glue; and in order to fix the cover sheets into the grooves 3, proper connection ways can be selected according to actual situations of the fabrication strip 2, which will not be limited herein.

In some embodiments, the second support pieces 42 are support sheets (i.e. howling sheets); and the howling sheets can be welded into the grooves 3.

In the frame component above according to the embodiments of the disclosure, the howling sheets can be welded into the grooves 3 or fixed into the grooves 3 in other ways, such as be adhered into the grooves 3 via a glue; and in order to fix the howling sheets into the grooves 3, proper connection ways can be selected according to actual situations of the fabrication strip 2, which will not be limited herein.

In some embodiments, the fabrication strip 2 and the support pieces 4 (including the cover sheets and the howling sheets) can be formed integrally, which will not be limited herein.

Evidently those skilled in the art can make various modifications and variations to the disclosure without departing from the spirit and scope of the disclosure. Accordingly the disclosure is also intended to encompass these modifications and variations thereto so long as the modifications and variations come into the scope of the claims appended to the disclosure and their equivalents.

The invention claimed is:

1. A frame component, comprising:
   a frame with a positioning slot in an inner edge thereof;
   a fabrication strip with grooves; and
   a plurality of support pieces;
   wherein:
   the fabrication strip is detachably arranged in the positioning slot;
   the plurality of support pieces are fixed in the grooves to form a support plane for supporting a mask;
   a depth of each of the grooves is not less than the thickness of each of the plurality of support pieces;
   the fabrication strip is arranged to form a welding plane for welding the mask; and
   the fabrication strip comprises a plurality of fabrication sheets adhered into the positioning slot, and an interval between every two adjacent fabrication sheets of the plurality of fabrication sheets constitutes one of the grooves.

2. The frame component according to claim 1, wherein the fabrication strip is welded into the positioning slot.

3. The frame component according to claim 2, wherein the fabrication strip is welded into the positioning slot by:
   welding a fabrication strip in an encircled shape into the positioning slot; wherein the fabrication strip in the encircled shape is fit closely onto an inner edge of the positioning slot along an internal contour of the positioning slot; and
   cutting the fabrication strip in the encircled shape via a laser cutting process at positions where the grooves need to be arranged, to obtain the grooves.

4. The frame component according to claim 2,
   wherein the plurality of fabrication sheets are fit closely onto an inner edge of the positioning slot, and are arranged spaced apart from each other along an internal contour of the positioning slot.

5. The frame component according to claim 1, wherein the fabrication strip is adhered into the positioning slot.

6. The frame component according to claim 5, wherein the fabrication strip is adhered into the positioning slot by:
   adhering a fabrication strip in an encircled shape into the positioning slot; wherein the fabrication strip in the encircled shape is fit closely onto an inner edge of the positioning slot along an internal contour of the positioning slot; and
   cutting the fabrication strip in the encircled shape via a laser cutting process at positions where the grooves need to be arranged, to obtain the grooves.

7. The frame component according to claim 5,
   wherein the plurality of fabrication sheets are fit closely onto an inner edge of the positioning slot, and are arranged spaced apart from each other along an internal contour of the positioning slot.

8. The frame component according to claim 1, wherein the fabrication strip is made of a metal material.

9. The frame component according to claim 8, wherein the metal material comprises an Invar36 or a SUS304.

10. The frame component according to claim 1, wherein a thickness of the fabrication strip is not less than a thickness of each of the plurality of support pieces.

11. The frame component according to claim 1, wherein a thickness of the fabrication strip is approximately 100 µm.

12. The frame component according to claim 1, wherein a depth of the positioning slot is greater than a thickness of the fabrication strip.

13. The frame component according to claim 12, wherein a difference between the depth of the positioning slot and the thickness of the fabrication strip ranges from 10 µm to 20 µm.

14. The frame component according to claim 1, wherein the frame has a rectangular-ring shape.

15. The frame component according to claim 14, wherein the plurality of support pieces comprise a plurality of first support pieces and a plurality of second support pieces, fixed in the grooves;

wherein the plurality of first support pieces and the plurality of second support pieces are parallel to two vertically intersected sides of the frame, respectively; the plurality of second support pieces cooperate with each other to form the support plane; and the plurality of first support pieces are configured to divide the support plane into a plurality of blocking areas.

16. The frame component according to claim 15, wherein the plurality of first support pieces are cover sheets; and the cover sheets are welded into the grooves.

17. The frame component according to claim 15, wherein the plurality of first support pieces are cover sheets; and the cover sheets are adhered into the grooves.

18. The frame component according to claim 15, wherein the plurality of second support pieces are howling sheets; and the howling sheets are welded into the grooves.

19. The frame component according to claim 15, wherein the plurality of second support pieces are howling sheets; and the howling sheets are adhered into the grooves.

20. The frame component according to claim 1, wherein the fabrication strip and the plurality of support pieces are formed integrally.

\* \* \* \* \*